United States Patent
Mensa et al.

(10) Patent No.: US 10,229,809 B2
(45) Date of Patent: *Mar. 12, 2019

(54) DEVICE FOR GENERATING A COMPOSITION-CONTROLLED AND INTENSITY-CONTROLLED IONIC FLOW AND RELATED METHOD

(71) Applicant: NANOTECH ANALYSIS S.R.L., Turin (IT)

(72) Inventors: Gianpiero Mensa, Turin (IT); Raffaele Correale, Turin (IT)

(73) Assignee: Nanotech Analysis S.R.L., Turin (IT)

( * ) Notice: Subject to any disclaimer, the term of this patent is extended or adjusted under 35 U.S.C. 154(b) by 0 days.

This patent is subject to a terminal disclaimer.

(21) Appl. No.: 15/322,623

(22) PCT Filed: Jul. 2, 2015

(86) PCT No.: PCT/IB2015/054993
§ 371 (c)(1),
(2) Date: Dec. 28, 2016

(87) PCT Pub. No.: WO2016/005865
PCT Pub. Date: Jan. 14, 2016

(65) Prior Publication Data
US 2017/0140894 A1 May 18, 2017

(30) Foreign Application Priority Data
Jul. 7, 2014 (IT) .............................. MI2014A1226

(51) Int. Cl.
*H01J 27/00* (2006.01)
*H01J 37/08* (2006.01)
(Continued)

(52) U.S. Cl.
CPC .......... *H01J 37/08* (2013.01); *F16K 99/0005* (2013.01); *F16K 99/0028* (2013.01);
(Continued)

(58) Field of Classification Search
CPC .... H01J 37/08045; H01J 37/147; H01J 49/00; H01J 49/02; H01J 49/06; H01J 49/067; H01J 49/24
(Continued)

(56) References Cited

U.S. PATENT DOCUMENTS

| 5,964,242 A | 10/1999 | Slocum |
| 7,767,959 B1 | 8/2010 | Freidhoff |

(Continued)

FOREIGN PATENT DOCUMENTS

| EP | 2273530 A1 | 1/2011 |
| EP | 2273531 A1 | 1/2011 |

(Continued)

OTHER PUBLICATIONS

International Search Report for PCT/IB2015/054993, dated Oct. 20, 2015.
(Continued)

*Primary Examiner* — Jason L McCormack
(74) *Attorney, Agent, or Firm* — Arent Fox LLP; Michael Fainberg

(57) ABSTRACT

A device 1 for generating a controlled ionic flow I is described. The device 1 is portable and comprises an ionization chamber 6, at least one inlet member 2 and at least one ion outlet member 3. The ionization chamber 6 is suitable to be kept at a vacuum pressure, and configured to ionize gaseous particles contained therein. The at least one inlet member 2 is configured to inhibit or allow and/or adjust an inlet in the ionization chamber of a gaseous flow Fi of said gaseous particles. In addition, the at least one inlet
(Continued)

member 2 comprises a gaseous flow adjusting interface 22, having a plurality of nano-holes 20, of sub-micrometric dimensions, suitable to be opened or closed, in a controlled manner, to inhibit or allow a respective plurality of gas micro-flows through the at least one inlet member 2.

15 Claims, 11 Drawing Sheets

(51) Int. Cl.
  *F16K 99/00* (2006.01)
  *H01J 27/20* (2006.01)
  *H01J 37/18* (2006.01)

(52) U.S. Cl.
  CPC ........ *F16K 99/0042* (2013.01); *H01J 27/205* (2013.01); *H01J 37/18* (2013.01); *H01J 2237/006* (2013.01); *H01J 2237/182* (2013.01); *H01J 2237/186* (2013.01)

(58) Field of Classification Search
  USPC ................................ 250/281, 282, 288, 424
  See application file for complete search history.

(56) References Cited

U.S. PATENT DOCUMENTS

| | | |
|---|---|---|
| 8,343,425 B1 | 1/2013 | Li et al. |
| 2006/0016983 A1 | 1/2006 | Kobayashi |
| 2007/0051412 A1* | 3/2007 | Heath ............... B01L 3/502738 137/561 R |
| 2007/0278401 A1* | 12/2007 | Finlay ................. H01J 49/0022 250/289 |
| 2009/0084976 A1 | 4/2009 | Camilli |
| 2010/0200746 A1 | 8/2010 | Osgood et al. |
| 2013/0043380 A1* | 2/2013 | Correale ............. G01N 1/2202 250/252.1 |

FOREIGN PATENT DOCUMENTS

| | | |
|---|---|---|
| GB | 2376562 A | 12/2002 |
| GB | 2411046 A | 8/2005 |
| WO | 2013/053039 A1 | 4/2013 |

OTHER PUBLICATIONS

Yanagisawa et al. "Magnetic Micro-Actuator" Proceedings of the Workshop on Micro Electro Mechanical Systems. Jan. 30-Feb. 2, 1991. pp. 120-124.

* cited by examiner

DEVICE FOR GENERATING A COMPOSITION-CONTROLLED AND INTENSITY-CONTROLLED IONIC FLOW AND RELATED METHOD

CROSS-REFERENCE TO RELATED APPLICATIONS

This application is a National Stage entry of International Application No. PCT/IB2015/054993 filed on Jul. 2, 2015, which claims priority to Italian Patent Application No. MI2014A001226 filed on Jul. 7, 2014. The disclosures of the prior applications are hereby incorporated in their entirety by reference.

FIELD OF APPLICATION

This invention relates to the field of devices and methods for the generation of controlled ionic flows and, in particular, the generation of ionic flows of controlled composition, intensity and modulation.

DESCRIPTION OF THE PRIOR ART

Ion source devices and/or systems are known for the generation of ion flows (also called "ionic flows") that provide for the ionization of gas molecules in an environment at vacuum pressure (for example, by means of electrons generated by a source comprised in the system) and the extraction of the ionized molecules, whose trajectory is controlled so as to form an ion beam that is emitted.

However, the ion beam emitted, in such known ion sources, is usually not precisely controlled because neither the intensity of the beam nor its composition are precisely controlled in terms of concentration of ions of different gaseous substances. Moreover, these ion sources are not able to effectively modulate the generated ion beam.

On the other hand, in many applications, for example in the field of the analysis of gas compositions and/or in the field of industrial process control through analysis of discharge gas, there is a need for ionic flow generation devices that are able to generate ionic flows controlled in intensity and composition, with high precision, and at the same time having a size such as to be easily located and installed (therefore, a need of portable devices) and having costs compatible with a reasonable use in the potential areas of application.

The known systems, mentioned above, are not able to meet such needs.

In the known systems, intensity can be controlled, for example, by means of a control of emission intensity of the ionization electrons. However, the control on the intensity of the emitted ion beam that can be obtained is not optimal, because such intensity also depends on the pressure in the ionization zone.

The modulation of the ion beam (for example through on/off cycles with frequencies up to a few tens of KHz) is, in fact, not possible with the known ion beam sources. Theoretically, it could be carried out by repeated switching on and off of the source, but this solution is, in fact, impractical at the desired frequencies and with reasonable levels of reliability.

As regards the control of the composition of the ion beam generated, the situation is even more complex. To achieve such control of composition, it would theoretically be possible to control the composition of the output ion beam by controlling the gas composition present in the ionization zone. However, this would entail building an entire system, comprising at least injectors of gas flows in the ionization zone, sophisticated means of measuring and calibrating the gas composition, and pumps for extracting gas from the ionization zone, so as to maintain it in conditions of vacuum pressure, also when input gaseous flows are present, to meet the necessary requirements in the ionization zone.

Such a system for generating ionic flows would obviously be very different from the desired portable device, and would be so complex, bulky and expensive as to be practically unacceptable for a large part of the potential applications.

Moreover, even such a system would not be able to ensure sufficient precision in the composition of the output ionic flow, since there is no guarantee that the pumping towards the outside is done in an exactly uniform manner for the different gaseous is substances present in the ionization zone.

Thus, the prior art is not able to satisfy the need to have devices for generating an ionic flow precisely controlled in intensity, modulation and composition and that are, at the same time, portable, versatile, easily installed, reliable and relatively inexpensive.

In light of the above, the object of this invention is that of devising and making available a device for the generation of controlled ionic flows, and related ionic flow generation methods, that are improved so as to meet the above-mentioned needs, and that are able to overcome, at least partially, the drawbacks described above with reference to the known art.

SUMMARY OF THE INVENTION

This object is achieved by a device according to claim 1.

Additional embodiments of the device are defined in the dependent claims from 2 to 15.

A method for generating an ionic flow, carried out by using the device of the invention, is defined in claim 16.

Further methods for generating an ionic flow, carried out by using the device of the invention, are defined in claims 17 and 18.

BRIEF DESCRIPTION OF THE DRAWINGS

Further characteristics and advantages of a device for generating a controlled ionic flow, and of methods using such a device, will result from the following description of preferred example embodiments, provided as non-limiting examples, with reference to the accompanying figures, wherein.

DETAILED DESCRIPTION

Figure 1:
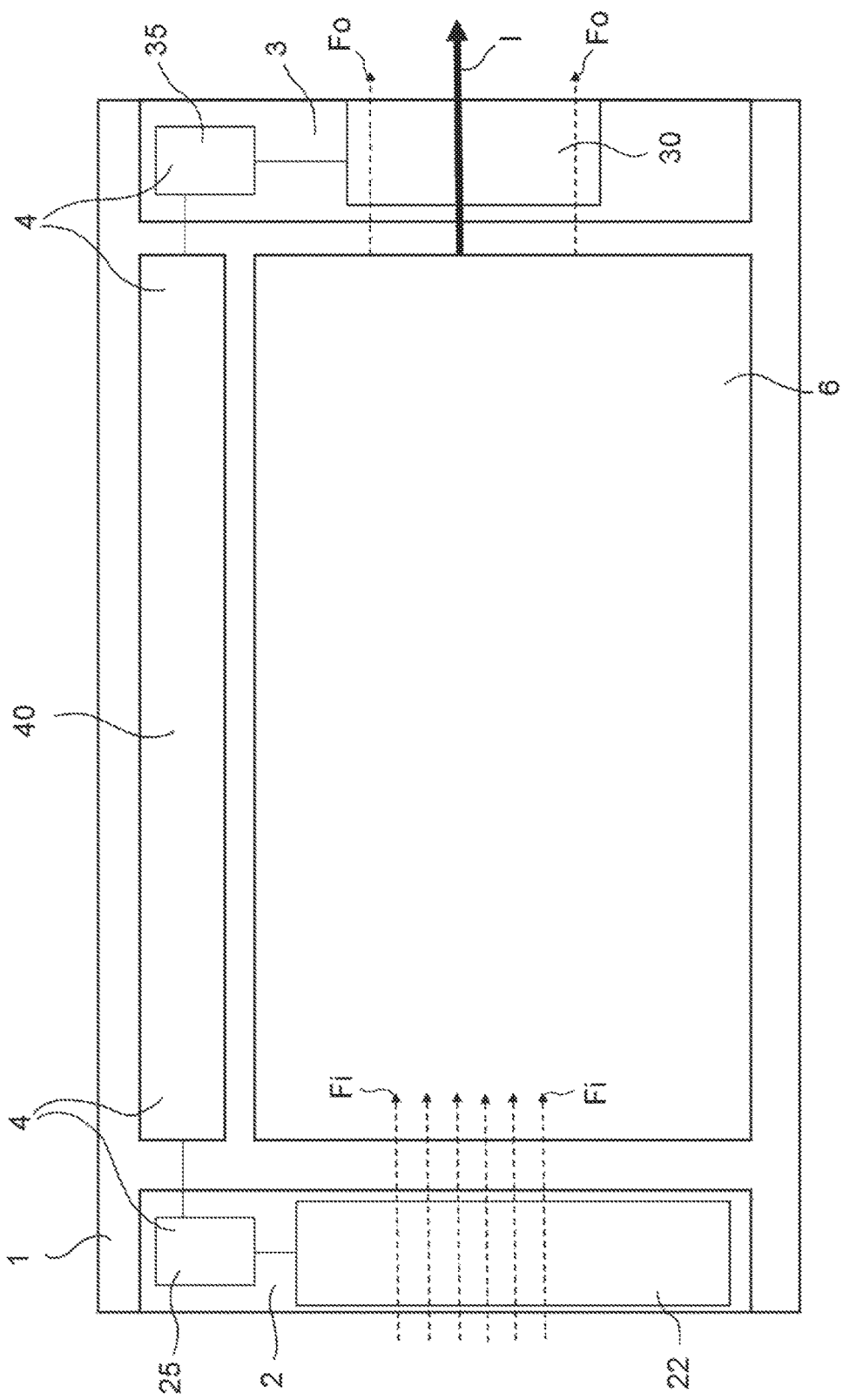
FIGS. 1-3 are simplified functional diagrams related to respective embodiments of a device according to the invention.

With reference to FIGS. 1-11 and, in particular, to the functional diagram of FIG. 1, a device 1 for generating a controlled ionic flow I is described.

The device 1 is portable and comprises an ionization chamber 6, at least one inlet member 2 and at least one ion outlet member 3.

The ionization chamber 6 is suitable to be kept at a vacuum pressure, and configured to ionize gaseous particles (i.e., gas molecules or, more generally, volatile substances) contained therein.

The at least one inlet member 2 is configured to inhibit or allow and/or adjust an inlet in the ionization chamber of a gaseous flow Fi of said gaseous particles. In addition, the at least one inlet member 2 comprises a gaseous flow adjusting interface 22, having a plurality of nano-holes 20, of sub-micrometer (i.e., sub-micrometric) dimensions, suitable to be opened or closed, in a controlled manner, to inhibit or allow a respective plurality of gas micro-flows through the at least one inlet member 2.

The at least one ion outlet member 3 is configured to inhibit or allow and/or adjust an output gaseous flow Fo and an ionic flow I, exiting the ionization chamber 6, of the generated ions. The at least one outlet member 3 comprises an orifice 30, suitable to be opened or closed in a controlled manner, so as to control an output conductance for the output gaseous flow Fo.

According to an embodiment, the device 1 also comprises control means 4.

The control means comprise inlet actuating means 25, configured to actuate in a controlled manner the at least one inlet member 2, and outlet actuating means 35 configured to actuate the at least one outlet member 3 in a controlled manner.

The inlet 25 and outlet 35 actuating means may be arranged, respectively, in the inlet member 2 and in the outlet member 3.

The control means 4 also comprise electronic processing means 40, configured to control the inlet actuating means 25, so as to selectively open or close said plurality of nano-holes 20, and the outlet actuating means 35, so as to controllably close or open the orifice 30.

According to an embodiment of the device, each of the nano-holes 20 is configured to allow the passage, even in conditions of atmospheric pressure or above, of a gas micro-flow, at a molecular or predominantly molecular regime, when open, and to inhibit said gas micro-flow, when closed, so that the total gaseous flow that passes through the at least one inlet member 2 is the sum of the micro-flows at molecular or predominantly molecular regime passing through open nano-holes.

The terminology "flow at a molecular regime," according to a commonly used nomenclature, means a gaseous flow in which the mean free path $\lambda$ of a gaseous particle (i.e., a molecule of gas) is comparable or larger than the dimensions D of the channel or container in which it is located, due to which the path of each particle is nearly free and independent with respect to that of the other particles.

The commonly accepted definitions, regarding the classification of flows, agree in defining "flow at molecular regime" as a flow in which the parameter D/A is comparable to, or less than, 1.

Moreover, a "flow at a predominantly molecular regime" is defined as a flow in which the parameter D/A is of the order of magnitude of a few units (conventionally, <10): in fact, in such conditions, although collisions between particles are not, strictly speaking, reduced to zero, most of the particles are in molecular regime conditions for most of the time.

The book "*Vacuum Technology*" by A. Roth, NHPC, 1976, Chapters 2 and 3, for example, can be considered as an authoritative theoretical reference on the subject.

Obviously, the mean free path $\lambda$ also depends on the conditions of pressure and temperature; in particular, it is directly proportional to the temperature measured in Kelvin and is inversely proportional to the pressure (see formula 2.56 in the above-mentioned reference text "*Vacuum Technology*"). Assuming that significant use conditions of valve systems are at ambient temperature conditions (for example in a range between 273° K and 313° K), or at a different temperature, as long as substantially constant, the pressure results to be the essential parameter.

In conditions of vacuum pressures (for example, below 1 mbar) and even more of high vacuum (for example, below $10^{-3}$ mbar) it is possible to obtain flows at a predominantly molecular regime even through channels of millimetric, or higher, dimensions.

On the contrary, in the other, non-vacuum, pressure conditions and, in particular, at atmospheric pressure or higher, it is necessary to reduce the dimensions of the channels to sub-micrometric values, as obtained thanks to the nano-holes with which the adjusting interface 22 of this device 1 is provided.

Figure 4:
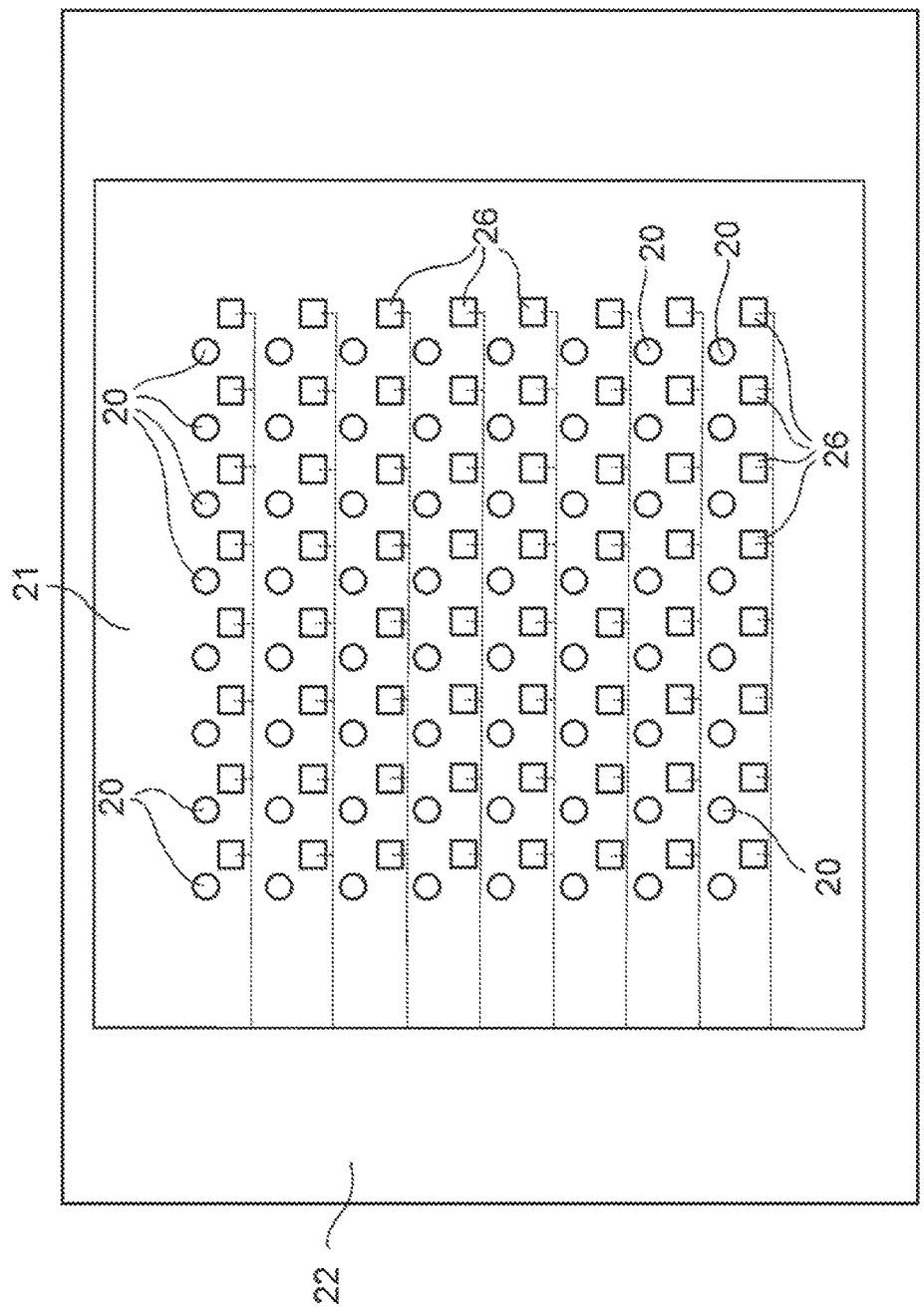
FIGS. 4 and 5 show a detail of a gaseous flow adjusting interface, comprised in an embodiment of the device, wherein nano-holes of such adjusting interface are, respectively, opened and closed.
Figure 5:
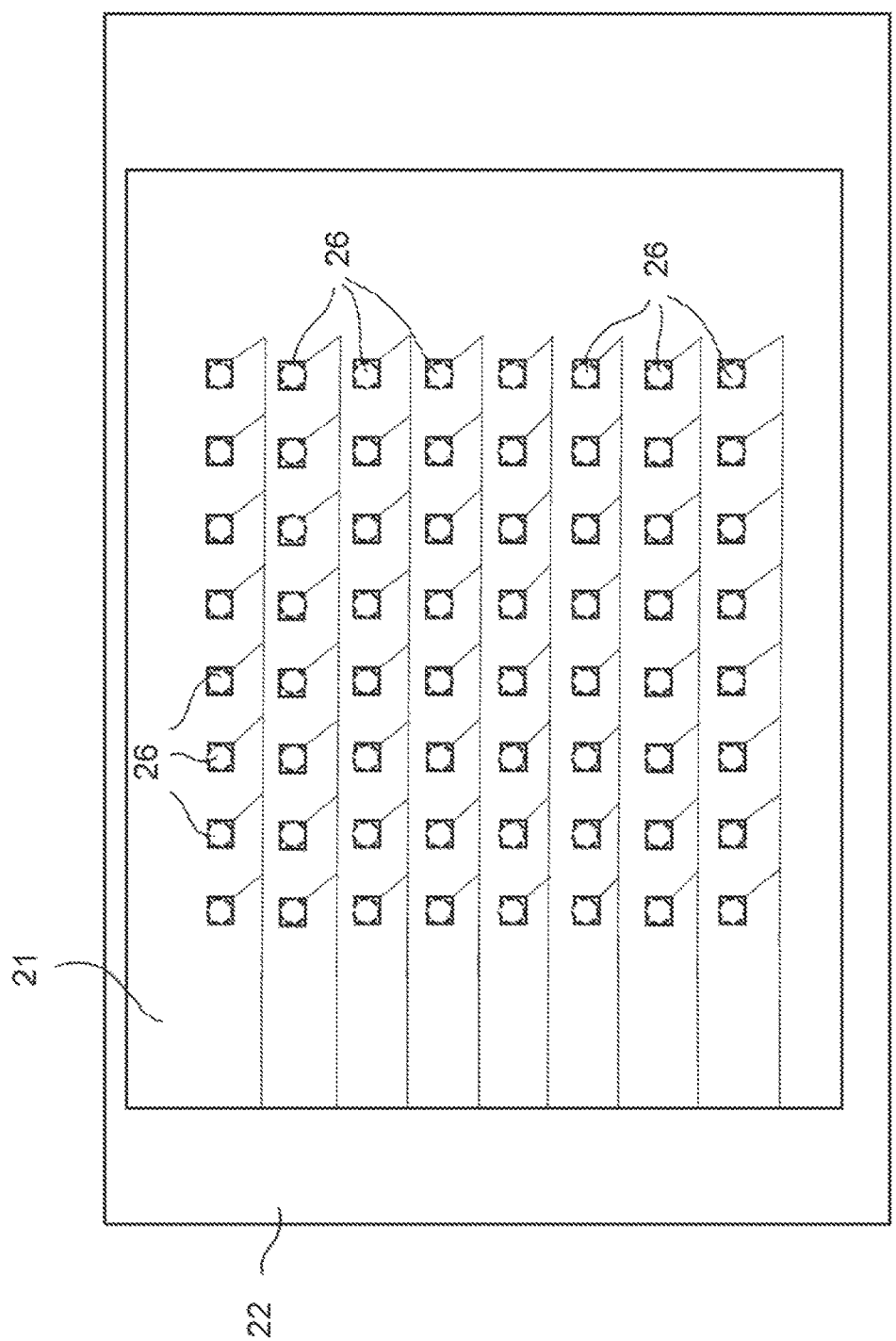

This adjusting interface 22 is illustrated in FIGS. 4 and 5.

According to an implementation example, each nano-hole 20 is configured to allow micro-flows between $10^{-8}$ and $10^{-6}$ mbar·l·sec$^{-1}$. In this way, the adjusting interface 22 can control gaseous flows with an accuracy and a very fine granularity, equal to one of these micro-flows. Other flow values are of course possible, depending on the dimensions with which the nano-holes are made, and on the pressure gradient to which the nano-holes are subjected.

The fact that the flow adjusting interface allows a passage of gas exclusively through nano-holes of sub-micrometric dimensions is enabling with respect to the functionality of allowing flows at molecular, or predominantly molecular, regime. In fact, it can be calculated that, within a very wide temperature range that covers all conditions of reasonable use, and for almost every type of gas, channels of sub-micrometric diameter allow obtaining the values of D/A desired (less than 10, in any case, and preferably comparable to 1 or lower) even at atmospheric or higher pressures.

Advantageously, the specific dimension chosen, within the sub-micrometric interval, for nano-holes of a specific embodiment of the device, can take into account of the pressure conditions specified in the conditions of use.

The sub-micrometric dimensions of each nano-hole imply that the diameter of the nano-hole (i.e., the dimension on a plane substantially perpendicular to the flow) is of the order of magnitude of hundreds of nanometers or less.

According to an implementation example, each nano-hole 20 has a diameter in the range from 10 to 100 nm, and preferably between 20 and 100 nm. Other values (for example between 50 and 500 nm) are possible, depending on the design specifications of the device.

According to an implementation example, the nano-holes are formed in a membrane 21, having a thickness of the order of hundreds of nanometers (nm) or lower (thus, typically an order of magnitude comparable to that of the diameter), and preferably between 50 and 500 nm.

According to a preferred embodiment, each nano-hole 20 has a defined geometry and a deterministically measurable conductance, the conductance being a parameter that quantifies the micro-flows that can pass through the nano-hole.

Preferably, the geometry of the nano-holes 20 is substantially cylindrical.

Thus, in the embodiment described above, each nano-hole is approximately a cylinder, or tube, having a diameter of the order of tens or hundreds of nm, and a height of the order of hundreds of nm.

According to various implementation examples covered by the invention, the distribution, number and size of the nano-holes 20, formed in a membrane 21 of the adjusting interface 22, may be the most varied. The adjusting interface 22 may thus comprise nano-holes 20 of all equal sizes, or different from each other, in any combination.

The number of nano-holes 20 of the adjusting interface 22 can vary by several tens to several hundreds, or even thousands. This advantageously allows obtaining flows of significant intensity, even if formed by micro-flows, by opening all the nano-holes.

The arrangement of the nano-holes 20 on the adjusting interface 22 may be the most varied.

According to a preferred implementation example, illustrated in FIGS. 4 and 5, the nano-holes 20 are arranged in a two-dimensional array of rows and columns.

According to a realization option, the adjusting interface 2 comprises one or more flow control windows, each window comprising a membrane 21, through which the nano-holes 20 are derived.

Each membrane 21 can be planar or non-planar.

In a typical implementation example, the membrane 21 is planar, substantially rectangular or square, with sides having dimensions of the order of tens of micrometers, and is able to contain a number of nano-holes of the order of hundreds.

It should be noted that the adjusting interface 2, with a membrane 21 and any predetermined arrangement of nano-holes having desired dimensions and geometries, can be obtained by techniques, in themselves known, for manufacturing membranes with holes of sub-micrometric dimensions.

Such techniques are known, for example, in the context of nano-technologies for the production of membranes for chemical-biological applications. Another example of usable techniques involves the use of silicon membranes that are perforated, in a controlled manner, by a SEM (Scanning Electron Microscope) equipped with a FIB (Forced Ion Beam) module. In this way, nano-holes of the type described above (in literature sometimes also called "nano-orifices" or "nano-pores") can be formed on the silicon membrane, as shown for example in the scientific papers: Lo, Aref, Bezryadin "*Fabrication of symmetric sub-5 nm nano-pores using focused ion and electron beams*" (Nanotechnology 17 (2006) 3264-3267); and Stein et al., "*Ion Beam Sculpting Time Scales*" (Physical Review Letter, vol. 89, no. 27, 30 Dec. 2002).

Referring now to the ways of actuating the nano-holes, it should be noted that the most various strategies are made possible by the structure of the device 1, illustrated here. In fact, the control means 4 are configured to control the gas flow Fi passing through the adjusting interface 22 by determining the pattern of open and closed nano-holes 20 in terms of the number and position of open and closed nano-holes, and/or by determining the ratio of the opening time and closing time of the nano-holes 20, or of the duty cycle and its frequency.

In a preferred example embodiment, able to offer a maximum flexibility of use, the processing means 40 are configured to control the inlet actuating means 25, so that each nano-hole 20 can be opened or closed individually and in an independent manner with respect to the other nano-holes 20.

According to an alternative example, also included in the invention, the processing means 40 are configured to control the inlet actuating means 25, so as to selectively open or close one or more groups of such nano-holes 20, comprising, for example, sub-sets of nano-holes adjacent to each other in an array of nano-holes. In this case, the nano-holes of each sub-set can be open or closed, independently of the opening/closing of the nano-holes of the other sub-sets.

According to another example, the nano-holes 20 are all open or all closed, collectively.

Figure 6:
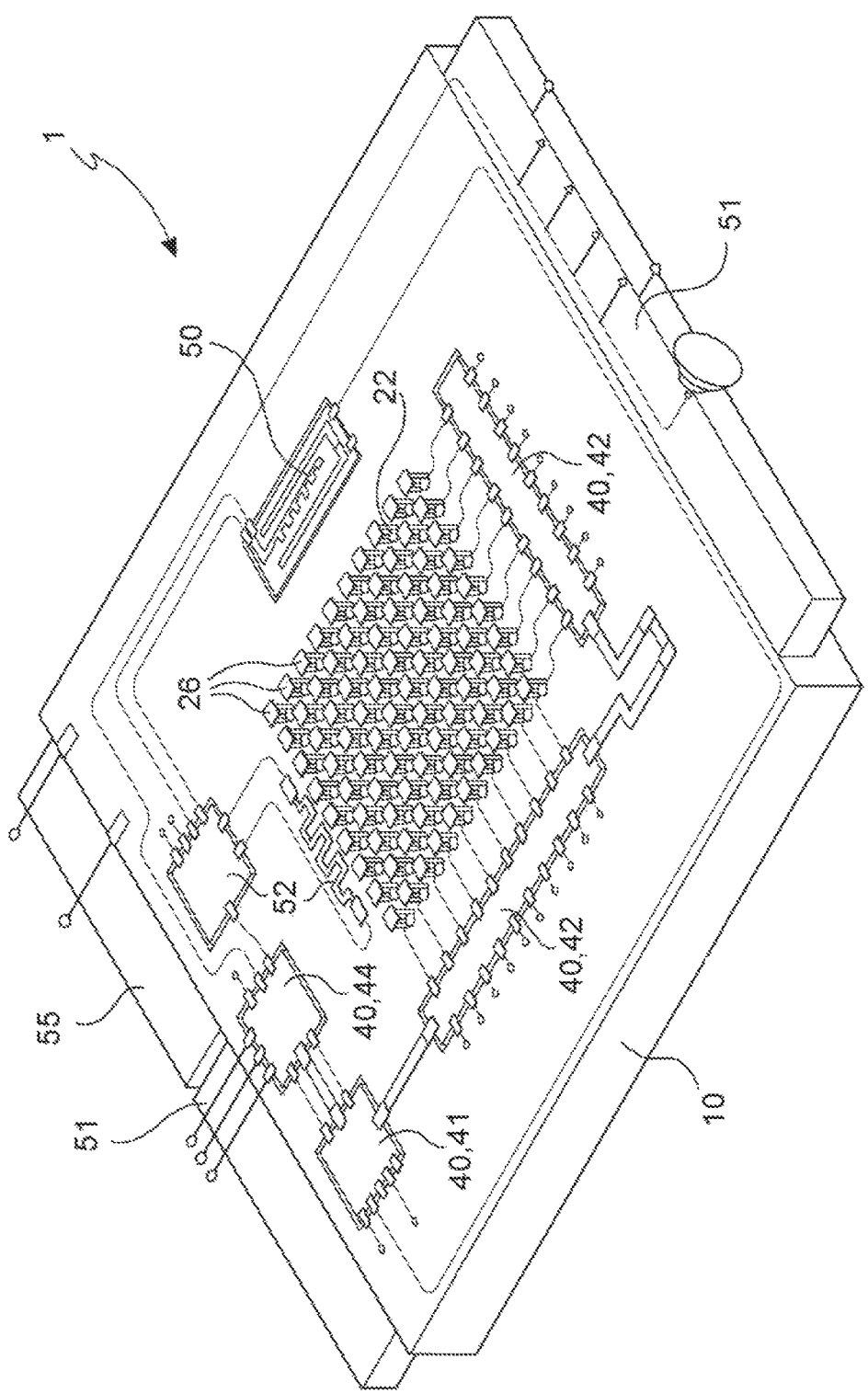
FIG. 6 is a perspective view of a portion of the device according to an embodiment.

By virtue of the above, the device 1 according to the invention provides a flow control in which any combination, pattern and/or arrangement of opened or closed nano-holes is possible: for example, with nano-holes all opened (as shown in FIGS. 4 and 6) or with nano-holes all closed (as shown in FIG. 5) or with some nano-holes opened and others closed. Furthermore, the combination, pattern and/or arrangement of opened or closed nano-holes can be dynamically changed over time in a desired manner.

In the examples illustrated in FIGS. 4-6, the inlet actuating means 25 comprise a plurality of miniaturized nano-hole opening/closure members 26, each of which is suitable to open or close a corresponding nano-hole 20, so as to minimize or maximize, respectively, the conductance of the nano-hole 20.

In a particular implementation example, each miniaturized nano-hole opening/closing member 26 is configured to hermetically seal the respective nano-hole 20, reducing to zero its conductance, or to fully open the nano-hole 20, allowing a flow of gas through it. The property of "hermetic" closure can be defined in the design stage in relation to the size of gaseous molecules whose flow must be controlled.

According to possible implementation options, the inlet actuating means 25 are actuated electro-mechanically or electro-magnetically.

According to an embodiment option, illustrated in FIG. 6, each miniaturized opening/closing member 26 comprises a plug 26 electro-mechanically actuatable to close or open the corresponding nano-hole 20, through an axial movement with respect to the nano-hole 20.

According to another embodiment option, each miniaturized closing/opening member comprises a micro-cantilever, electro-magnetically actuatable, having, at an oscillating end, a substantially conical tip, suitable to be inserted in or extracted from the nano-hole.

According to a still further embodiment option, each miniaturized closing/opening member comprises a cylinder, having a diameter substantially equal to that of the corresponding nano-hole, the cylinder being electro-magnetically actuatable to be inserted in, or extracted from, the corresponding nano-hole, through an axial movement with respect to the nano-hole.

The options described above provide for an individual and independent actuation of each nano-hole.

For applications in which a collective actuation of the nano-holes is sufficient, a further implementation option provides that the inlet actuating means 25 comprise a multiple opening/closing oscillating planar member, configured to concurrently open/close all the nano-holes 20 of the adjusting interface 2.

In this case, the single miniaturized nano-hole opening/closing members can be arranged on one side of the planar member in a configuration corresponding to that of the nano-holes, so that each miniaturized opening/closing member is simultaneously inserted into, or extracted from, the corresponding nano-hole, upon a corresponding movement of the planar member.

According to an implementation example, the inlet actuating means 25 are arranged on a side of the adjusting interface 22 and are configured to open/close the opening of each nano-hole 20 corresponding to that side.

According to an alternative implementation example, such inlet actuating means 25 (or at least parts of them) are arranged on both sides of the adjusting interface 22, and are configured for opening/closing both openings of each nano-hole 20, corresponding to both sides of the adjusting interface 22, i.e., both ends of the tubular micro-channel formed by the nano-hole. In this case, each miniaturized nano-hole opening/closing member 26 is configured to penetrate into the nano-hole 20, in conditions of closure, entering from the respective side.

Advantageously, the miniaturized opening/closing members 26 are also suitable (or configurable) for cleaning and clearing each nano-hole 20 of possible obstructions (due, for example to molecular mono-layers that may be deposited), upon each operative event of closure and subsequent opening or upon specific anti-obstruction closing/opening events. This property is important to allow the use of the device in the most various environments, including environments of industrial processes with pollutants.

Figure 7:
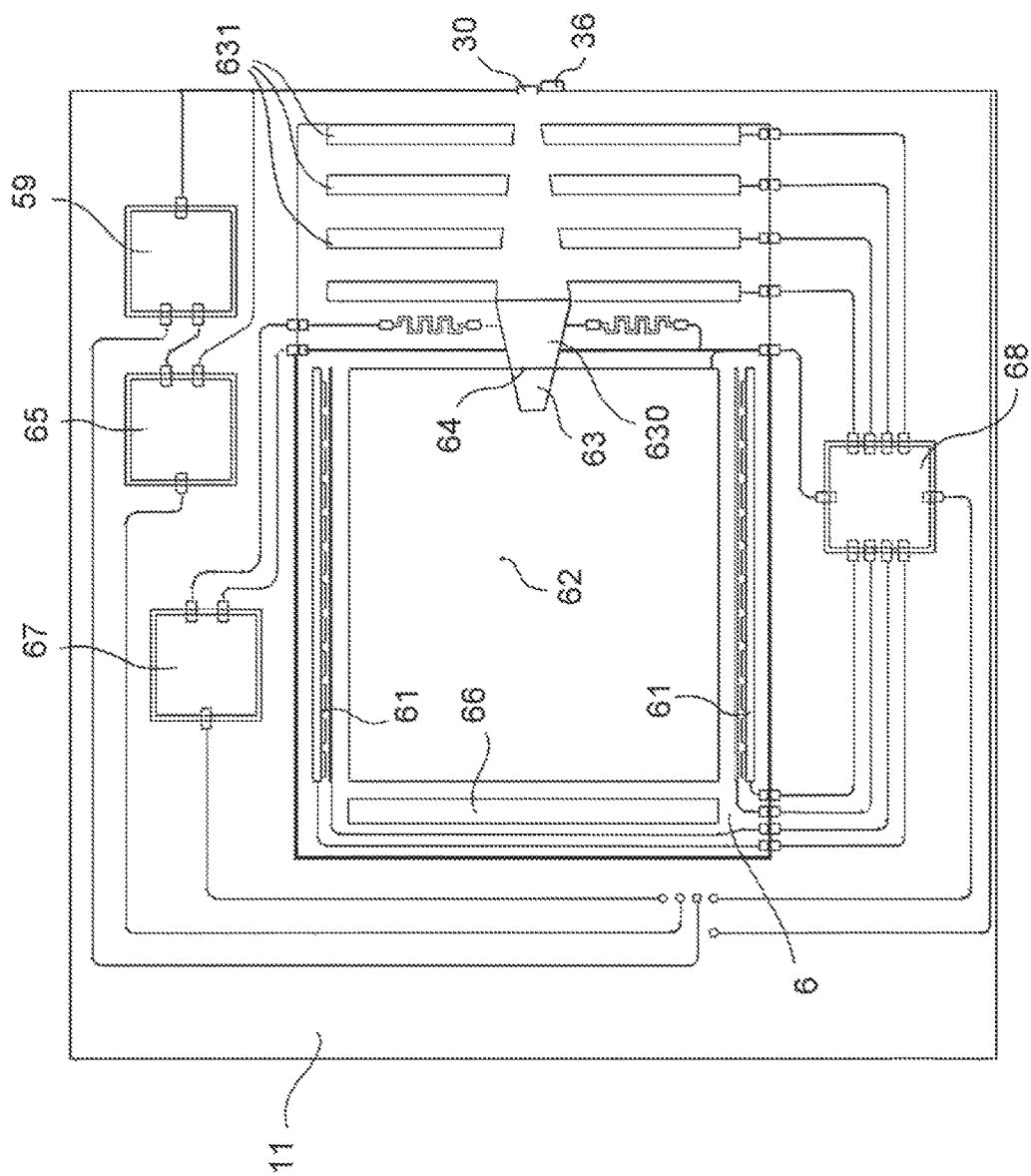
FIGS. 7 and 8 are, respectively, a top view and a perspective view of another portion of the device, according to an embodiment.
Figure 8:
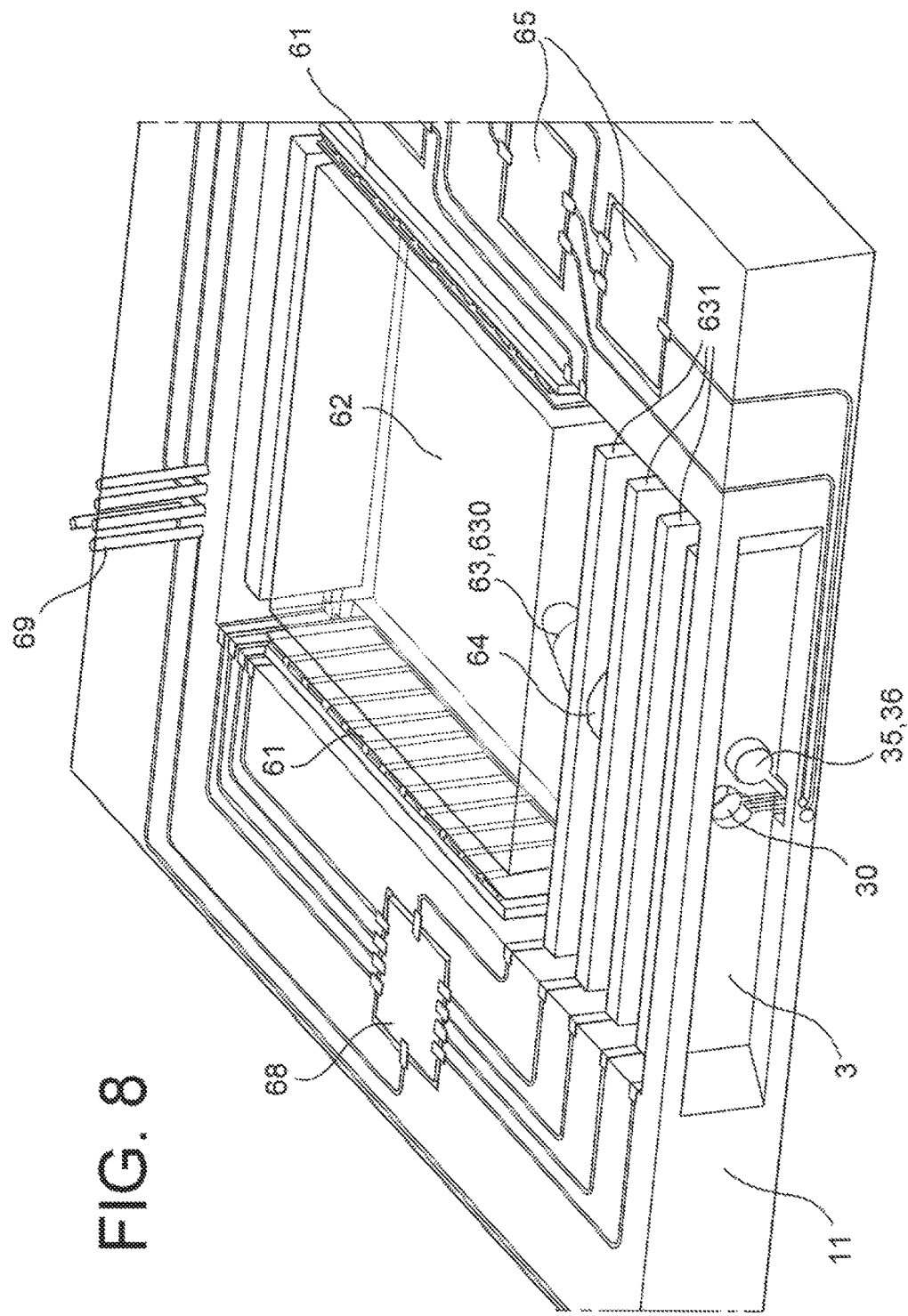

Now, the at least one outlet member 3, shown for example in FIGS. 7 and 8, is considered.

According to an implementation example, the at least one outlet member 3 is further configured to control and/or modulate over time the intensity of the output ionic flow I.

For this purpose, in such implementation option, the outlet actuating means 35 comprise, for each of the at least one outlet member 3, a respective shutter 36, configured to completely close, or keep completely open, or partially obstruct in a controlled manner the orifice 30 of the at least one outlet member 3.

In particular, the movement of the shutter 36 can be controlled electro-mechanically, by the processing means 40, so that the shutter 36 takes an opening position, in which it keeps fully open the orifice 30, or a closing position, in which it keeps the orifice 30 hermetically closed, or a plurality of intermediate positions, which determine a corresponding plurality of conditions for the opening/partial occlusion of the orifice 30.

In addition, it is also possible to drive the shutter 36 with a periodic opening/closing cycle according to a desired duty cycle, for example having an appropriate oscillation frequency.

In the example illustrated in FIG. 8, the shutter 36 has a pendulum shape.

According to an implementation option, the outlet actuation means 35 are configured to control the output gas flow Fo through an adjustment of the size of the opening of the orifice 30, and to control the modulation of the outlet ionic flow I through an adjustment of the duration of closing and opening periods of the orifice 30, or of an opening/closing duty cycle of the orifice 30.

Furthermore, the outlet actuation means 35 are also configured to contribute to controlling the pressure in the ionization chamber 6 by adjusting the duration of closure and opening periods of the orifice 30, or a closure/opening duty cycle of the orifice 30.

According to an implementation example, the at least one outlet member 3 is further configured to measure the intensity of the outlet ionic flow I. For this purpose, the shutter 36 can be equipped with a meter of the intensity of the ion beam, or be part of such intensity meter.

With reference now to FIGS. 7 and 8, further details regarding the ionization chamber 6 of the device 1 will be illustrated.

In an embodiment, the ionization chamber 6 comprises ionization chamber control means 65, and at least one ionization source 61.

The ionization chamber 6 comprises an ionization region 62, containing gaseous particles entering which has been allowed to enter by the at least one inlet member 2, and is arranged so as to be crossed, for example, by ionization electrons generated by the ionization source 61, so that the ionization electrons ionize the gaseous particles (i.e., gaseous molecules), thus generating respective ions (i.e., ionized molecules).

The ionisation chamber 6 also comprises ion extracting means 63, configured to determine a preferential trajectory for the generated ions, passing through at least one ion extraction window 64, through which the ions exit the ionization region 62, and to subsequently guide the ions toward the at least one outlet member 3. For this purpose, the ions extracting means 63 comprise generators of time- and spatially-controlled electric and/or magnetic field.

The ionization source 61 may be an electron emission source, in itself known, such as, for example, an EI (Electron Ionization) source, in particular a field-effect "cold" emission source, such as a nano-tube source or plasma source, or by means of laser ionization.

According to an implementation example illustrated in FIG. 7, the ion extracting means 63 comprise at least one extractor and/or an ionic guide 630, in itself known, to extract the ions from the ionization region 62; and further comprise at least one electrostatic lens 631, configured to define a path for the ions from the ion extraction window 64 to the orifice 30 of the at least one outlet member 3 and to generate a collimated ion beam I as output flow.

According to an implementation example, the ionization chamber 6 further comprises a magnetic field generator, configured to generate controlled magnetic fields, in order to improve control on the trajectory of the ionizing electrons.

Considering now the device in its entirety, with the ionization chamber 6 and the inlet and outlet members 2 and 3, as described above, it should be noted that the control means 4 can be configured, as previously illustrated, to achieve the functional objects of the device.

In particular, the control means 4 are configured to adjust the input gaseous flow Fi and the output gaseous flow Fo so as to maintain a desired pressure value, inside the ionization chamber 6, at a level sufficiently low to ensure that even the output gaseous flow Fo occurs at a molecular, or predominantly molecular, regime.

This consequently causes that the partial gas concentrations, inside the ionization chamber 6, reproduce the partial gas concentrations that are present in an external environment to which the at least one inlet member 2 is exposed and, therefore, that the partial ion concentrations, in the output ion flow I, are deterministically representative of such partial gaseous concentrations. In particular, in the case in which the ionization cross sections of the different gaseous particles are equal or very similar, the partial ion concentrations exactly reproduce the partial gas concentrations. If the ionization cross sections are different, they are still deterministically known with great accuracy, whereby the partial ion concentrations can be related, again in a deterministic and precise manner, to the partial gas concentrations.

Advantageously, the device 1 can be configured to operate in environments with atmospheric, or higher, pressure, and to maintain a pressure inside the ionization chamber 6 comprised for example between $10^{-2}$ mbar and $10^{-6}$ mbar.

The above-mentioned internal pressure of the ionization chamber 6 is a vacuum, or high vacuum, pressure. This allows the ionization of the gaseous particles and, at the same time, ensures that the output gaseous flow Fo, exiting from an environment at vacuum pressure, is at a molecular, or predominantly molecular, regime.

On the other hand, as already noted, the adjusting interface allows an input flow Fi at molecular or predominantly molecular regime even when interfaced to an environment at atmospheric, or higher, pressure.

The intensity of the micro-flows at molecular or predominantly molecular regime of gaseous substances is inversely proportional to the square root of the mass of the gaseous substances, but such an imbalance occurs in the same way in input and output, causing an exact compensation.

Due to this fact, it is possible to achieve the functionality, described above, of generating an ionic flow I having partial ion concentrations equivalent to the partial gaseous concentrations present in the external environment in which the device is located.

If, then, the device is equipped with multiple inlet members, interfaced to respective different environments in which there are known gaseous concentrations, it is possible to obtain a further advantageous functionality.

Figure 2:
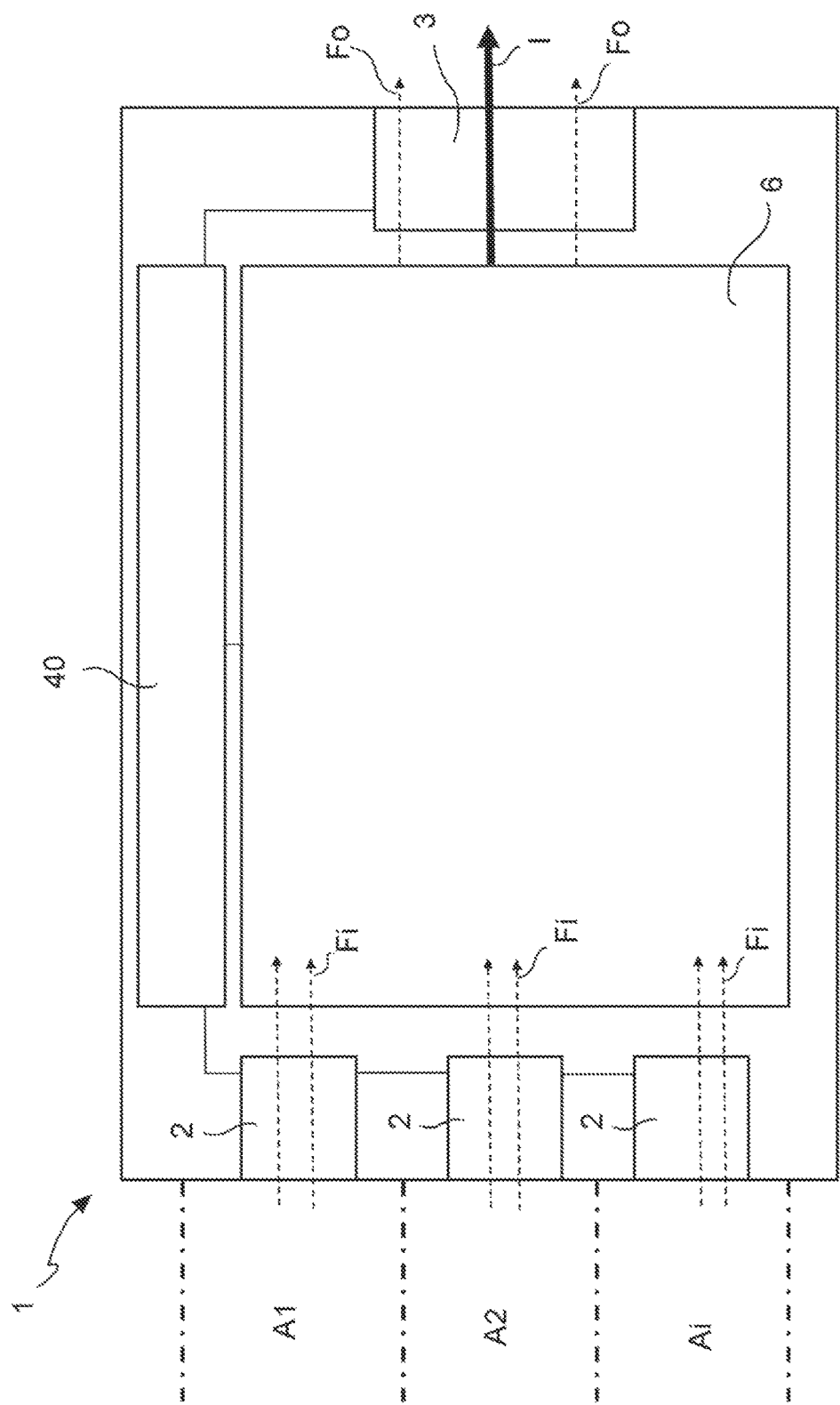

This is achieved through a further embodiment of the device, illustrated in FIG. 2, wherein the device 1 comprises a plurality of inlet members 2, each exposed to a respective external environment A1-Ai with a respective partial gas concentration. The control means 4 are configured to adjust the input gaseous flow Fi, from the inlet members 2, and the output gaseous flow Fo so as to maintain a desired pressure value, inside the ionization chamber 6, at a level sufficiently low so as to ensure that even the output gaseous flow Fo occurs at a molecular, or predominantly, molecular regime (even with an output orifice having dimensions of the order of millimeters or tens of millimeters). This consequently causes that the partial gas concentrations, inside the ionization chamber 6, depend on a controllably weighted sum of the partial gas concentrations that are present in said external environments A1-Ai; and that the partial ion concentrations, in the output ionic flow I, are deterministically representative of the controllable gaseous concentrations, which are present inside the ionization chamber 6.

Also in this case, the device 1 can be configured to operate in environments with atmospheric, or higher, pressure, and to maintain a pressure inside the ionization chamber 6 comprised between $10^{-2}$ mbar and $10^{-6}$ mbar (vacuum pressure).

According to an implementation option, the control means 4 are also configured to control the intensity and/or the modulation in time of the output ionic flow I, so that the output ionic flow I is controllable in concentration, intensity and modulation.

According to a particular implementation example, the control means 4 are configured to control the intensity of the output ionic flow I by acting on the pressure in the ionization chamber and/or on the generation of electrons by the ionization source 61.

Figure 3:
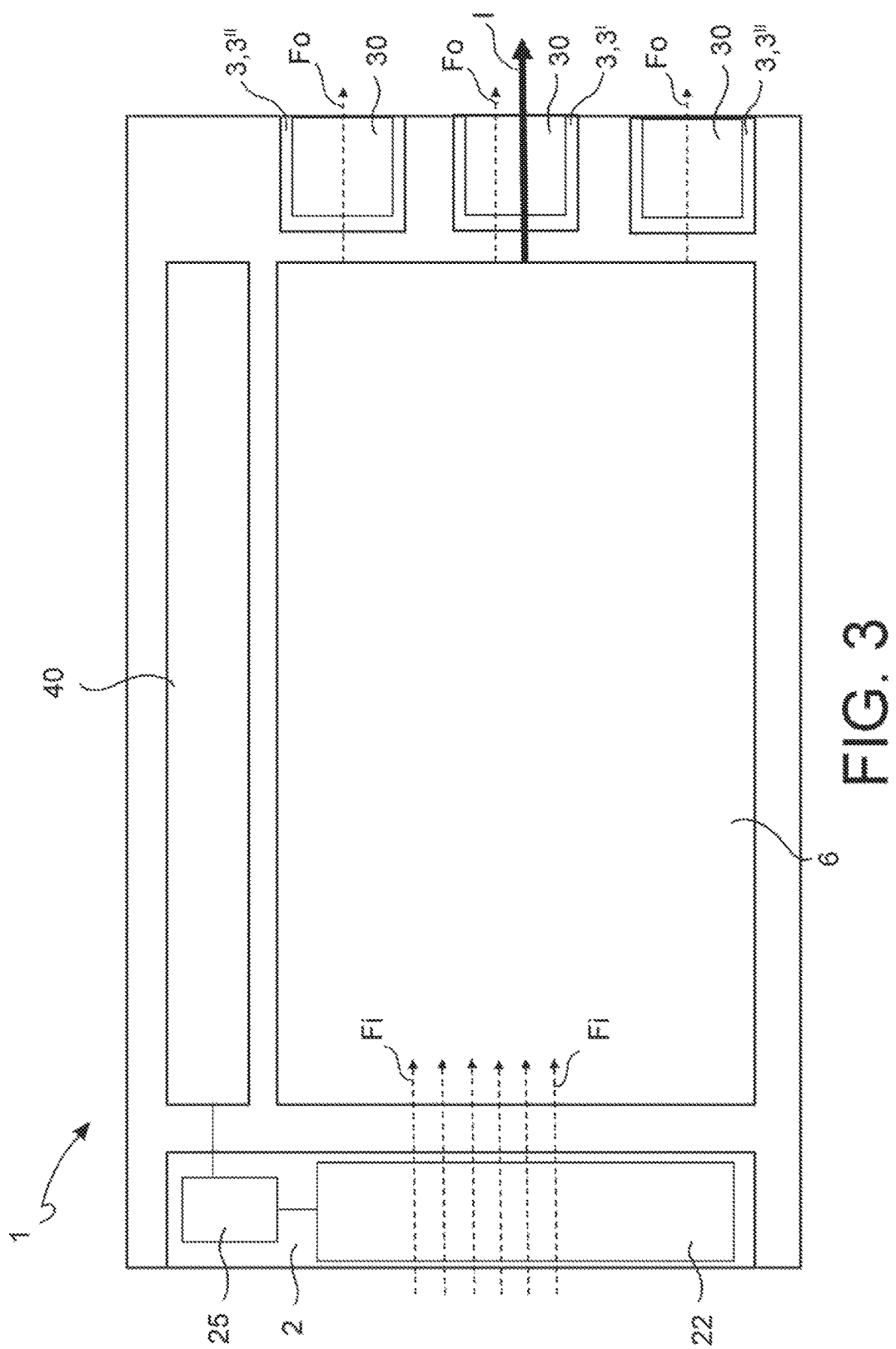

In accordance with a further embodiment of the device 1, illustrated in FIG. 3, the device 1 comprises a plurality of outlet members 3 and respective orifices 30, among which there are an ionic flow outlet member 3' and one or more gaseous flow outlet members 3".

The control means 4 are configured to modulate the output ionic flow I through an adjustment of the opening size of the ionic flow outlet member 3'; and also to control the output gaseous flow Fo and the pressure inside the ionization chamber 6 through an adjustment of the opening and/or duration of periods of closure and opening and/or an opening/closing duty cycle of the orifices 30 of the gaseous flow outlet members 3".

According to an implementation option, the control means 4 are configured to allow an input gas flow input and an output conductance, so as to maintain in the ionization chamber 6 a pressure dependent on the ratio between input gas flow and output conductance.

According to another implementation option, the control means 4 are further configured to vary, in a controlled manner, the pressure in the ionization chamber 6, by means of a suitable actuation of the at least one outlet member 3, so as to increase the pressure in the ionization chamber, based on the input flows, the volume of the ionization chamber, and an effective conductance of the output orifice (starting from a zero value up to a maximum value), which in turn depends on the opening/closing actuation times of the at least one outlet member 3.

With reference now to further structural and functional aspects of the device, shown in FIGS. 6-11, the following aspects should be noted.

The electronic processing means 40 comprise a processor 44, operatively electrically connected to the inlet 25 and outlet 35 actuating means, so as to control them by sending electric signals.

With reference to the inlet actuation control means 25, the processor 44 is operatively electrically connected to each of the nano-hole opening/closing members 26.

In an implementation example, shown in FIG. 6, the electronic processing means 40 further comprise a buffer (that can be integrated in the same processor), a driving member 41 and a multiplexer 42. The buffer is operatively connected to the processor 40 to receive opening/closure control signals relating to a plurality of nano-holes. The driving member 41 is operatively connected to the buffer to sequentially receive said opening/closure control signals, and configured to sequentially generate corresponding opening/closure driving signals relating to a plurality of nano-holes. The multiplexer 42 is operatively connected to the driving member 41 to receive in succession said opening/closure driving signals and configured to direct each opening/closing driving signal to a corresponding nano-hole 20 of the plurality of nano-holes.

The implementation described above, exploiting the fact that the speed of generation of the opening/closing commands can be significantly higher than the execution speed of the actuation, advantageously allows providing the device with a single driving member that sequentially generates the control signals for all the actuating members of the single nano-holes.

According to a further embodiment, the device 1 also comprises at least one first pressure sensor 59 and at least one second pressure sensor 50.

The first pressure sensor 59 (shown in FIG. 7) is arranged within or in proximity to the ionization chamber 6, and is configured to measure a pressure value, present in the ionization chamber 6.

The second pressure sensor 50 (shown in FIG. 6) is arranged outside the ionization chamber 6, for example, outside the adjusting interface 22, and is configured to measure a pressure value, present in an environment outside the ionization chamber.

The first 59 and second 50 pressure sensors are further configured to provide to the processing means 40 the respective measured pressure values.

According to an embodiment, the device 1 also comprises an input/output interface 51, operatively connected to the electronic processing means 4, and configured to send outside the device, or to receive from outside the device, control and/or monitoring and/or calibration and/or diagnostic signals.

In several implementation examples comprised in the invention, the electronic processing means 4 are configured to control a gaseous flow through the adjusting interface 22 on the basis of control signals coming from outside the device via the input/output interface 51, and/or on the basis of the pressure values measured by the miniaturized pressure sensors 50, 59 and/or on the basis of the measured values of the output ionic flow.

Optionally, the device 1 also comprises a reference pressure sensor (not shown in the figures), encapsulated in a sealed and/or openable environment, and configured to provide a reference signal to the processing means 4 for calibration and/or diagnostic functions of the device.

According to an implementation example, the device 1 also comprises a power supply interface 55 (illustrated in FIG. 6).

According to an implementation example, the device 1 also comprises an electric power supply 68 for the ionization chamber (illustrated in FIG. 7).

According to a realization option, the device 1 also comprises first controlled heating means 52, configured to maintain a desired temperature in proximity to the adjusting interface 22, under the control of the processing means 4.

According to a further realization option, the device 1 also comprises second controlled heating means 67, configured to maintain a desired temperature in the ionization chamber 6, under the control of the processing means 4.

According to a further example embodiment, the device 1 also comprises particulate filtering means 53 (for example, equipped with micrometric frame filters), arranged so as to cover at least the adjusting interface 22 of the least one inlet member 2, to prevent a pollution of the ionization chamber 6 and/or an obstruction of the nano-holes 20.

Furthermore, the device 1 may comprise thin protection films, configured to reduce the adsorption of process gas (for example, hydrophobic films to prevent the adsorption of moisture present in the process environment) and prevent corrosion.

It should be noted that the electronic processing means 4 can be configured to perform a diagnostic procedure of the device 1, on the basis of a processing of the data received from the pressure sensors 50, 59, and/or measurement data of the intensity of the ion beam I and/or stored data relating to nominal predetermined operating conditions or operating environmental conditions in which the device 1 is destined to be placed, so as to identify possible operating anomalies of the device 1.

In addition, the electronic processing means 4 may be configured to perform, if the diagnostic procedure gives a negative result, a procedure for the adjustment and/or compensation and/or optimisation of the device 1, by acting on operating parameters of the device to correct and/or compensate for the operating anomalies identified, based on the results of the above-mentioned diagnostic procedure.

With reference now to aspects of structural implementation, it should be noted that, in a preferred embodiment, the device 1 is an integrated device.

According to an implementation option, the ionization chamber 6, the at least one inlet member 2 and the at least one outlet member 3 are comprised in a single miniaturized chip of the integrated device 1.

Figure 9:
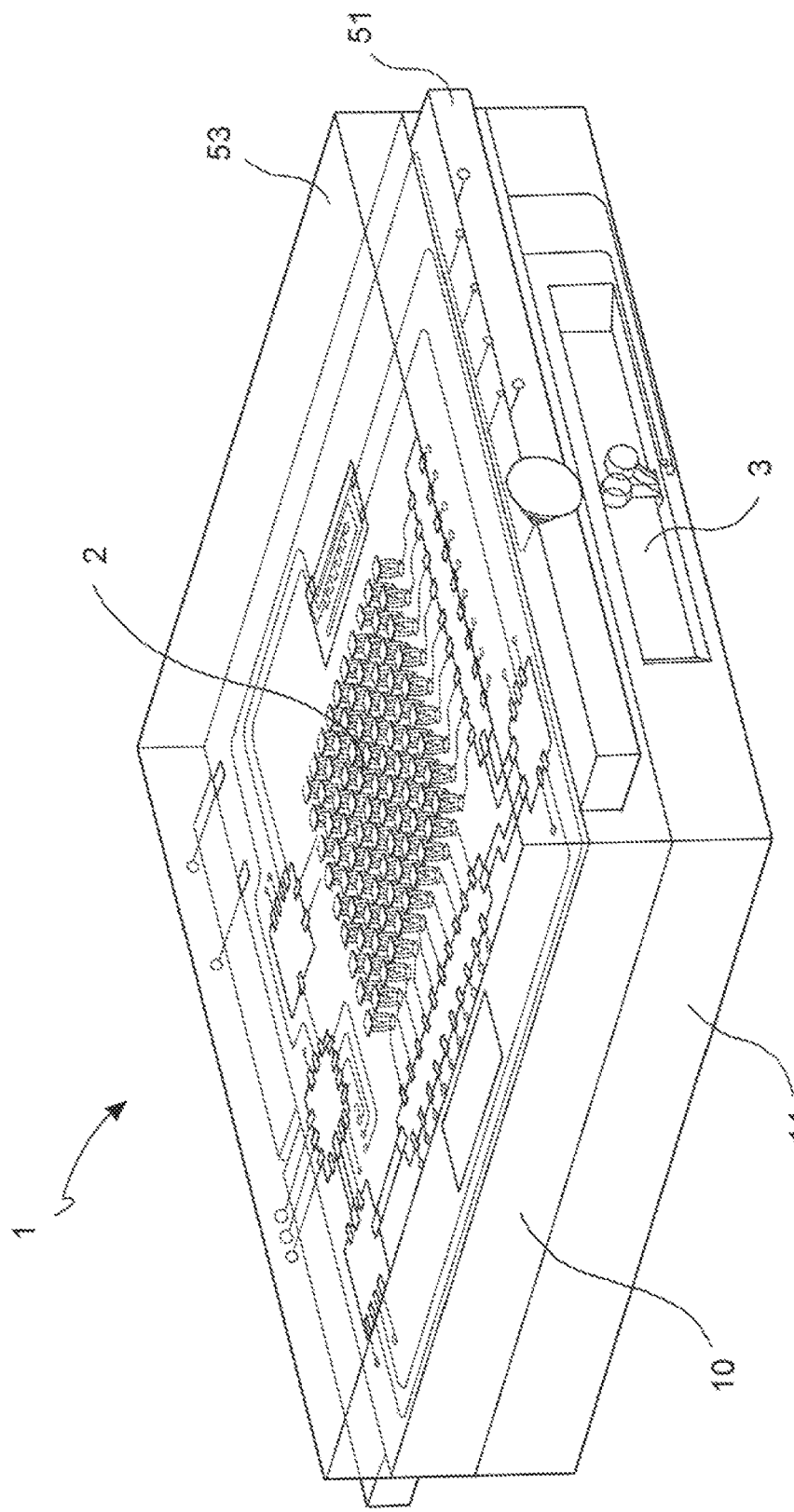
FIG. 9 shows a perspective view of a device comprising the portions shown in FIGS. 7 and 8.
Figure 10:
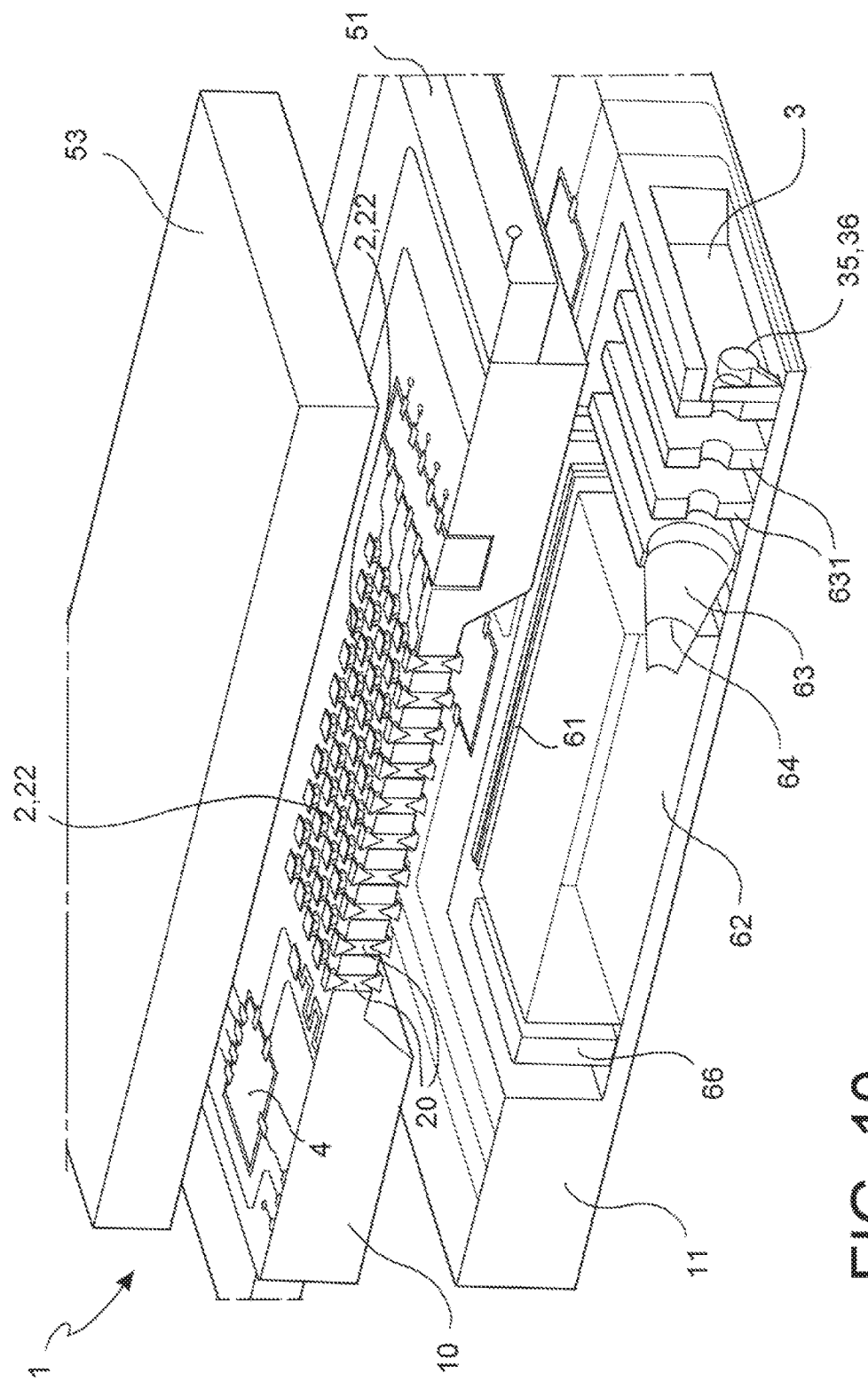
FIG. 10 shows a partial exploded sectional view of the device of FIG. 9.
Figure 11:
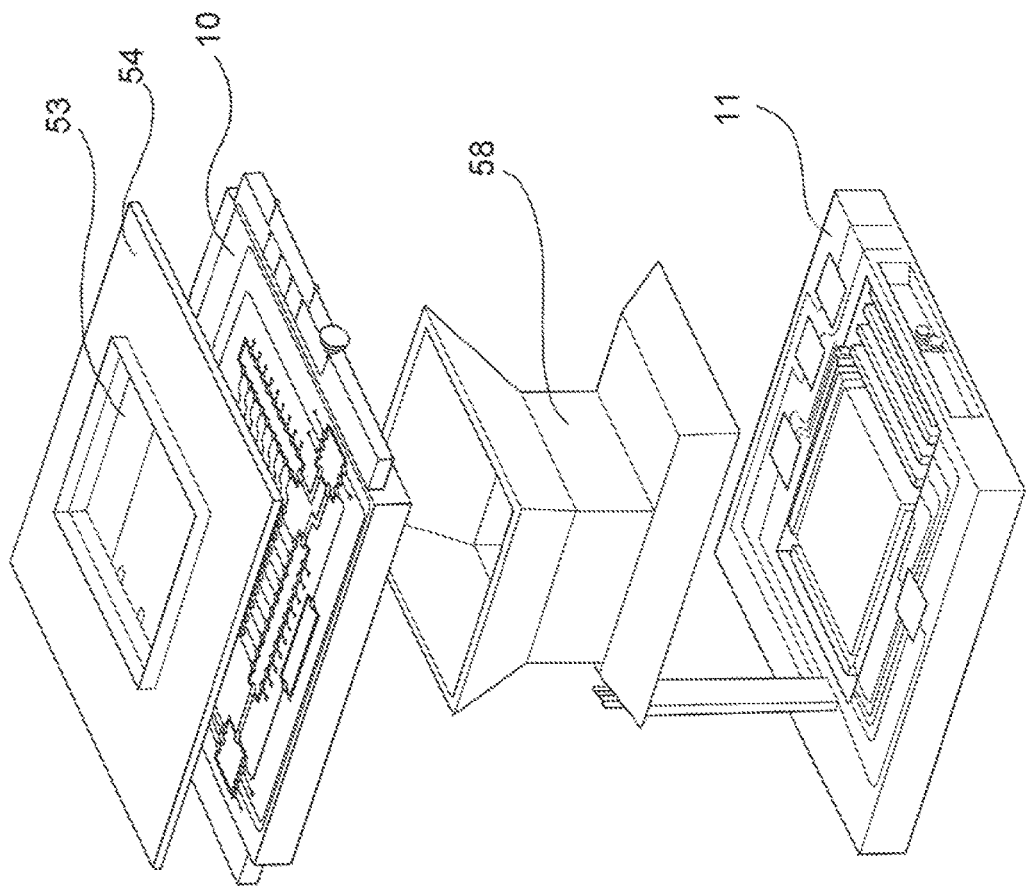
FIG. 11 shows an exploded view of a device according to a further embodiment.

According to another implementation option, illustrated in FIGS. 9-11, the device 1 is an integrated device, comprising a first chip 10, in which the at least one inlet member 2 is implemented, and a second chip 11, in which the ionization chamber 6 and the at least one outlet member 3 are implemented. The first chip 10 is overlapped to the second chip 11 so as to allow, exclusively through the at least one inlet member 2, a gaseous flow Fi to enter the second chip.

According to an embodiment, the device 1 comprises a connector member 58, configured to physically separate the above-mentioned first 10 and second 11 chip, while allowing an operating connection.

According to an implementation option, the device 1 comprises a further connector member 54, configured to physically separate the electronic processing means 40 from the inlet member 2, the ionization chamber 6 and the outlet member 3 while, at the same time, allowing an operating connection.

According to an implementation example, the device 1 further includes a pumping member, configured to speed up the emptying times of the ionization region, for example between one measurement and another one.

Below, methods comprised in the invention will be described.

The invention comprises a method for generating a controlled ion flow I, comprising the steps of: producing vacuum conditions in an ionization chamber 6, in communication with the outside exclusively through at least one inlet member 2 and at least one outlet member 3; then, inhibiting or allowing in a controlled manner an input gaseous flow Fi to pass through an adjusting interface 22 of the at least one inlet member 2, comprising a plurality of nano-holes 20 having sub-micrometer dimensions, wherein each of the nano-holes is suitable to be opened or closed, to allow or inhibit the passage of a corresponding micro-flow at a molecular or predominantly molecular regime, so that the overall gas flow Fi passing through the adjusting interface 22 is the sum of the micro-flows passing through the open nano-holes.

The method then comprises the steps of inhibiting or allowing in a controlled manner an output gaseous flow Fo to pass through an orifice 30 of the at least one outlet member 3; then, adjusting the input gaseous flow Fi and the output gaseous flow Fo so as to maintain a pressure value, inside the ionization chamber 6, at a level sufficiently low to ensure that even the output gaseous flow Fo occurs at a molecular or predominantly molecular regime, so that the partial gas concentrations, inside the ionization chamber 6, reproduce the partial gas concentrations that are present in an external environment to which the at least one inlet member 2 is exposed.

In addition, the method comprises the steps of ionizing the gaseous particles inside the ionization chamber 6, so as to obtain partial ion concentrations that reproduce said partial gas concentrations; and, finally, extracting the ions generated in the ionization is chamber 6 in the form of an output ion beam, having partial ion concentrations that are deterministically representative of the above partial gas concentrations, to obtain a ionic flow I having known partial ion concentrations.

In a particular embodiment, the method comprises the further step of controlling the output intensity of the ionic flow I.

In another example embodiment, the method further comprises the steps of exposing the at least one inlet member 2 to an environment to be sampled, and of detecting the intensity-controlled ion beam, having partial ion concentrations representative of the partial gaseous concentrations of the environment to be sampled.

The invention also comprises a method for generating a controlled ionic flow I, comprising the steps of: producing vacuum conditions in an ionization chamber 6, in communication with the outside exclusively through a plurality of inlet members 2, each being exposed to a respective external environment A1-Ai with a respective partial gas concentration, and at least one outlet member 3; then, inhibiting or allowing in a controlled manner an input gaseous flow Fi to pass through each of the inlet members, having corresponding adjusting interfaces 22, each comprising a plurality of nano-holes 20 having sub-micrometer dimensions, each of the nano-holes 20 being suitable to be opened or closed, to inhibit or allow the passage of a corresponding micro-flow at a molecular or predominantly molecular regime, so that the overall gas flow passing through each of the adjusting interfaces 22 is the sum of the micro-flows passing through the open nano-holes.

The method then comprises the steps of inhibiting or allowing in a controlled manner an output gaseous flow Fo to pass through an orifice 30 of the at least one outlet member 3; then, adjusting the input gaseous flow Fi and the output gaseous flow Fo so as to maintain a desired pressure value, inside the ionization chamber 6, at a level sufficiently low to ensure that even the output gaseous flow Fo occurs at a molecular or predominantly molecular regime, so that the partial gas concentrations, inside the ionization chamber 1, depend on a controllably weighted sum of the partial gas concentrations that are present in said external environments A1-Ai.

The method also comprises the steps of ionizing the gaseous particles inside the ionization chamber 6, so as to obtain partial ion concentrations that are deterministically representative of the above-mentioned partial gas concentrations present in the ionisation chamber 6; and, finally, extracting the ions generated in the ionization chamber in the form of an output ion beam, having partial ion concentrations that are deterministically representative of the above-mentioned partial gas concentrations, to obtain a ionic flow I having desired partial ion concentrations.

In a particular embodiment, the method comprises the further step of controlling the output intensity and/or the modulation of the ion flow I.

In another example embodiment, the method further comprises the steps of exposing the at least one inlet member 2 to environments A1-Ai having known gaseous concentrations, and of detecting the intensity-controlled ion beam, having partial ion concentrations representative of the desired partial gaseous concentrations, said partial ion concentrations being completely controllable.

As can be seen, the object of this invention is achieved by the device described previously, by virtue of the characteristics illustrated.

From the above description, it is apparent that the device of this invention is able to generate ionic flows having a known and/or desired intensity and composition, in a controlled manner.

In fact, due to the structure of the device, and to the related functionalities of controlling the input and output flows in the ionization chamber, the device is able to control the gas composition in the ionization chamber and the consequent ion composition of the output ion beam.

In particular, the device allows, as explained above, managing micro-flows, at a molecular or predominantly molecular regime, entering and exiting the ionization chamber. This allows controlling the gas composition inside the ionization chamber by simply arranging the device in fluidic communication with an environment at atmospheric pressure, in which a known or desired concentration is present, and injecting gaseous micro-flows from it directly to the vacuum-pressure ionization chamber. These micro-flows are at molecular or predominantly molecular regime, which implies that the intensity of the micro-flows of gaseous substances is inversely proportional to the square root of the mass of the gaseous substances themselves. This imbalance is, however, exactly compensated by the fact that also the output flow, from the vacuum-pressure ionization chamber, is at molecular or predominantly molecular regime, so that the partial gas concentrations inside the ionization chamber remain constant, at the desired level.

In addition, the device allows controlling the intensity and/or modulation of the output ion beam, as explained above.

Moreover, the device, thanks to its characteristics described above, is portable; in an implementation option, it can even be constructed in integrated form, by means of one or more chips. The device is also easily installed and is versatile, since it is usable in a plurality of different applications.

Finally, due to the above-mentioned self-calibration and self-diagnostic functionalities, the device can meet high reliability requirements.

Similar advantages can be identified for the methods of generating ionic flows, previously described.

To the embodiments of the device for generating a controlled ionic flow, described above, and the related methods, a technician in the field, to satisfy contingent requirements, may make modifications, adaptations and replacements of members with others functionally equivalent, even jointly with the prior art, even creating hybrid embodiments, without departing from the scope of the following claims. Each of the characteristics described as belonging to a possible embodiment can be achieved independently from the other embodiments described. Also note that the term "comprising" does not exclude other elements or steps and the "a" or "one" does not exclude a plurality. Moreover, the figures are not necessarily to scale; on the contrary, importance is generally given to the illustration of the principles of this invention.

The invention claimed is:

1. A device for generating a controlled ion flow (I), the device being portable and comprising:
    an ionization chamber, suitable to be kept at a vacuum pressure, and configured to ionize gaseous particles contained therein;
    at least one inlet member, configured to inhibit or allow and/or adjust an inlet in the ionization chamber of a gaseous flow (Fi) of said gaseous particles;

at least one outlet member, configured to inhibit or allow and/or adjust an output gaseous flow (Fo) and an ion flow (I), exiting the ionization chamber, of the generated ions;

wherein the at least one inlet member comprises a gaseous flow adjusting interface, having a plurality of nano-holes, of sub-micrometric dimensions, suitable to be opened or closed, in a controlled manner, to inhibit or allow a respective plurality of gas micro-flows through the at least one inlet member;

and wherein the at least one outlet member comprises an orifice, suitable to be opened or closed, in a controlled manner, so as to control an output conductance for the output gaseous flow (Fo).

2. The device according to claim 1, further comprising control means, comprising:

inlet actuating means, of the at least one inlet member, configured to actuate in a controlled manner the at least one inlet member;

outlet actuating means, of the at least one outlet member, configured to actuate in a controlled manner the at least one outlet member;

electronic processing means, configured to control the inlet actuating means, so as to selectively open or close said plurality of nano-holes, and the outlet actuating means, so as to controllably close or open said orifice.

3. The device according to claim 1, wherein said device is an integrated device.

4. The device according to claim 1, wherein each of the nano-holes is configured to allow a gas micro-flow at a molecular or predominantly molecular regime, even in conditions of atmospheric pressure or above, when it is open, and to inhibit said gas micro-flow, when it is closed, so that the overall gaseous flow passing through the at least one inlet member is the sum of the micro-flows at molecular or predominantly molecular regime passing through open nano-holes.

5. The device according to claim 1, wherein the at least one outlet member is further configured to control and/or modulate over time the intensity of the output ion flow (I).

6. The device according to claim 2, wherein the outlet actuating means comprise at least one shutter, associated to a respective at least one outlet member, and configured to completely close, or keep completely open, or partially obstruct in a controlled manner the orifice of the at least one outlet member.

7. The device according to claim 1, wherein the ionization chamber comprises:

at least one ionisation source;

an ionization region, containing gaseous particles which has been allowed to enter by the at least one inlet member, the ionization region being arranged so as to ionize the gaseous particles, and generate corresponding ions;

ion extracting means, configured to determine a preferential trajectory for the generated ions, passing through at least one ion extraction window, through which the ions exit the ionization region, and to subsequently guide the ions toward the at least one outlet member;

ionization chamber control means.

8. The device according to claim 2, wherein the control means are configured to adjust the input gaseous flow (Fi) and the output gaseous flow (Fo) so as to maintain a desired pressure value, inside the ionization chamber, at a level sufficiently low to ensure that even the output gaseous flow (Fo) occurs at a molecular or predominantly molecular regime, consequently implying that:

the partial gas concentrations, inside the ionization chamber, reproduce the partial gas concentrations that are present in an external environment to which the at least one inlet member is exposed;

the partial ion concentrations, in the output ion flow (I), are representative of said partial gas concentrations.

9. The device according to claim 2, comprising a plurality of inlet members, each being exposed to a respective external environment (Ai) with a respective partial gas concentration, wherein the control means are configured to adjust the input gaseous flows (Fi), from the at least one inlet member, and the output gaseous flow (Fo) so as to maintain a desired pressure value, inside the ionization chamber, at a level sufficiently low to ensure that even the output gaseous flow (Fo) occurs at a molecular or predominantly molecular regime, consequently implying that:

the partial gas concentrations, inside the ionization chamber, depend on a controllably weighted sum of the partial gas concentrations that are present in said external environment (Ai);

the partial ion concentrations, in the output ion flow (I), are representative of said controllably weighted sum of the partial gas concentrations, which are present inside the ionization chamber.

10. The device according to claim 2, wherein the outlet actuating means are configured for:

controlling the output gaseous flow (Fo) by adjusting the opening dimension of the orifice;

controlling the modulation of the output ion flow (I) by adjusting the duration of closure and opening periods of the orifice, or a closure/opening cycle time of the orifice;

controlling the pressure inside the ionization chamber by adjusting the duration of closure and opening periods of the orifice, or the closure/opening cycle time of the orifice.

11. The device according to claim 2, wherein the control means are configured to control the gas flow (Fi) passing through the gaseous flow adjusting interface by determining the pattern of open and closed nano-holes, in terms of the number and position of open and closed nano-holes, and/or by determining the ratio of the opening time and closure time of the nano-holes, or of the operative cycle.

12. The device according to claim 1, further comprising at least one first pressure sensor, inside the ionization chamber, configured to measure a pressure value, which is present in the ionization chamber, and at least one second pressure sensor, outside the ionization chamber, configured to measure a pressure value, which is present in an external environment with respect to the ionization chamber, said first and second pressure sensors being further configured to provide the corresponding measured pressure values to the processing means.

13. The device according to claim 1, comprising a first chip, in which the at least one inlet member is implemented, and a second chip, in which the ionization chamber and the at least one outlet member are implemented, and wherein the first chip is overlapped to the second chip so as to allow, exclusively through the at least one inlet member, a gaseous flow (Fi) to enter the second chip.

14. A method for generating a controlled ion flow (I), comprising:

producing vacuum conditions in an ionization chamber, in communication with the outside exclusively through at least one inlet member and at least one outlet member;

inhibiting or allowing in a controlled manner an input gaseous flow (Fi) to pass through an adjustment interface of the at least one inlet member, comprising a plurality of nano-holes having sub-micrometric dimensions, each of the nano-holes being suitable to be opened or closed, to allow or inhibit the passage of a corresponding micro-flow at a molecular or predominantly molecular regime, so that the overall gas flow (Fi) passing through the adjustment interface is the sum of the micro-flows passing through the open nano-holes;

inhibiting or allowing in a controlled manner an output gaseous flow (Fo) to pass through an orifice of the at least one outlet member;

adjusting the input gaseous flow (Fi) and the output gaseous flow (Fo) so as to maintain a pressure value, inside the ionization chamber, at a level sufficiently low to ensure that even the output gaseous flow (Fo) occurs at a molecular or predominantly molecular regime, so that the partial gas concentrations, inside the ionization chamber, reproduce the partial gas concentrations that are present in an external environment to which the at least one inlet member is exposed;

ionizing the gaseous particles inside the ionization chamber, so as to obtain partial ion concentrations that reproduce said partial gas concentrations;

extracting the ions generated in the ionization chamber in the form of an output ion beam, having partial ion concentrations that are deterministically representative of said partial gas concentrations, to obtain a ion flow (I) having known partial ion concentrations.

15. A method for generating a controlled ion flow (I), comprising:

producing vacuum conditions in an ionization chamber, in communication with the outside exclusively through a plurality of inlet members, each being exposed to a respective external environment (Ai) with a respective partial gas concentration, and at least one outlet member;

inhibiting or allowing in a controlled manner an input gaseous flow (Fi) to pass through each of the at least one inlet member, having corresponding adjustment interfaces, each comprising a plurality of nano-holes having sub-micrometric dimensions, each of the nano-holes being suitable to be opened or closed, to allow or inhibit the passage of a corresponding micro-flow at a molecular or predominantly molecular regime, so that the overall gas flow passing through each of the adjustment interfaces is the sum of the micro-flows passing through the open nano-holes;

inhibiting or allowing in a controlled manner an output gaseous flow (Fo) to pass through an orifice of the at least one outlet member;

adjusting the input gaseous flow (Fi) and the output gaseous flow (Fo) so as to maintain a pressure value, inside the ionization chamber, at a level sufficiently low to ensure that even the output gaseous flow (Fo) occurs at a molecular or predominantly molecular regime, so that the partial gas concentrations, inside the ionization chamber, depend on a controllably weighted sum of the partial gas concentrations that are present in said external environment (Ai);

ionizing the gaseous particles inside the ionization chamber, so as to obtain partial ion concentrations that are deterministically representative of said partial gas concentrations that are present in the ionization chamber;

extracting the ions generated in the ionization chamber in the form of an output ion beam, having partial ion concentrations that reproduce said partial ion gas concentrations that are present in the ionization chamber, to obtain a ion flow (I) having desired partial ion concentrations.

* * * * *